United States Patent
Ma et al.

(10) Patent No.: US 7,589,648 B1
(45) Date of Patent: *Sep. 15, 2009

(54) DATA DECOMPRESSION

(75) Inventors: Benny Ma, Saratoga, CA (US); San-Ta Kow, San Jose, CA (US); Ann Wu, San Jose, CA (US); Thomas Tsui, Cupertino, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 680 days.

This patent is subject to a terminal disclaimer.

(21) Appl. No.: 11/054,855

(22) Filed: Feb. 10, 2005

(51) Int. Cl.
*H03M 7/00* (2006.01)
(52) U.S. Cl. .............. 341/87; 341/50; 341/65; 341/67; 326/37; 326/38; 707/101
(58) Field of Classification Search .............. 710/68
See application file for complete search history.

(56) References Cited

U.S. PATENT DOCUMENTS

| | | | |
|---|---|---|---|
| 3,717,851 A | 2/1973 | Cooke | |
| 4,829,475 A * | 5/1989 | Ward et al. ............ | 365/78 |
| 4,899,149 A | 2/1990 | Kahan | |
| 5,099,481 A * | 3/1992 | Miller .................. | 714/724 |
| 5,173,695 A | 12/1992 | Sun | |
| 5,467,087 A * | 11/1995 | Chu ..................... | 341/51 |
| 5,563,592 A * | 10/1996 | Cliff et al. ............ | 341/63 |
| 5,745,734 A | 4/1998 | Craft et al. | |
| 5,754,734 A | 5/1998 | Emeott | |
| 5,768,372 A | 6/1998 | Sung et al. | |
| 5,794,033 A | 8/1998 | Aldebert | |
| 5,805,609 A * | 9/1998 | Mote, Jr. .............. | 714/726 |
| 5,872,529 A | 2/1999 | Mejia | |
| 5,953,503 A | 9/1999 | Mitzenmacher | |
| 6,028,445 A | 2/2000 | Lawman | |
| 6,038,185 A | 3/2000 | Ng | |
| 6,044,025 A | 3/2000 | Lawman | |
| 6,127,953 A * | 10/2000 | Manzardo ............. | 341/87 |
| 6,191,710 B1 * | 2/2001 | Waletzki .............. | 341/63 |
| 6,327,634 B1 | 12/2001 | Statovici | |
| 6,483,342 B2 | 11/2002 | Britton | |
| 6,493,862 B1 | 12/2002 | Young | |
| 6,507,214 B1 | 1/2003 | Snyder | |
| 6,507,943 B1 | 1/2003 | Kelem | |
| 6,525,678 B1 | 2/2003 | Veenstra | |
| 6,563,437 B1 | 5/2003 | Landry et al. | |
| 6,564,285 B1 | 5/2003 | Mills | |
| 6,744,388 B1 * | 6/2004 | Khu .................... | 341/51 |

(Continued)

OTHER PUBLICATIONS

Tang, U.S. Appl. No. 10/809,658, filed Mar. 25, 2004.

(Continued)

*Primary Examiner*—James Trujillo
*Assistant Examiner*—Albert Phillips

(57) ABSTRACT

In one embodiment, a data decompression circuit for a data stream having a repeated data word is provided. The data stream is compressed into a series of data frames such that the repeated data word is removed from the series of data frames and such that each data frame corresponds to a header. The circuit includes a decompression engine configured to decompress each data frame into a corresponding decompressed data frame, the decompression engine being further configured to decode each header to identify whether word locations in the corresponding decompressed data frame should be filled with the repeated data word.

10 Claims, 2 Drawing Sheets

U.S. PATENT DOCUMENTS

| | | | |
|---|---|---|---|
| 6,772,230 | B2 | 8/2004 | Chen |
| 6,785,165 | B2 | 8/2004 | Kawahara |
| 6,885,227 | B2 | 4/2005 | Agrawal |
| 6,903,574 | B2 | 6/2005 | Chen |
| 7,019,577 | B2 | 3/2006 | Agrawal |
| 7,034,599 | B1 | 4/2006 | Agrawal |
| 2002/0091905 | A1* | 7/2002 | Geiger et al. ............... 711/170 |
| 2004/0061147 | A1 | 4/2004 | Fujita |
| 2004/0064622 | A1 | 4/2004 | Smith |
| 2005/0229061 | A1* | 10/2005 | Kang et al. ................. 714/738 |

OTHER PUBLICATIONS

Tang, U.S. Appl. No. 11/243,255, filed Oct. 4, 2005.
Chen, U.S. Appl. No. 11/346,817, filed Feb. 3, 2006.
Callahan, U.S. Appl. No. 11/530,620, filed Sep. 11, 2006.
Booth, U.S. Appl. No. 11/494,862, filed Jul. 28, 2006.
Atmel Corporation, AT17LV(A) Series FPGA Configuration Memory, Ref. 0437K-CNFG-May 2003, pp. 1-18.
Atmel Corporation, FPGA Configuration EEPROM Memory, 2322F-CNFG, Jun. 2005, pp. 1-18.
Altera Corporation, Configuring Cyclone II Devices, Cyclone Device Handbook, Jul. 2005, vol. 1, Chapters 13-14, pp. 13-1 to 13-4.

* cited by examiner

DATA DECOMPRESSION

TECHNICAL FIELD

The present invention relates generally to data decompression, and more particularly to the dynamic decompression of data.

BACKGROUND

Many types of electronic devices require that information be loaded from a source and stored in a memory. For example, programmable logic devices are configured to implement a desired logical function based upon configuration data provided by a programming tool. The configuration data may be stored internally for a non-volatile device or externally for a volatile device. Regardless of whether the configuration data is stored internally or externally, the increasing complexity of programmable logic devices requires larger and larger amounts of configuration data. This increased configuration data size produces delays in the configuration process and increases the costs.

During the configuration process, the configuration data is typically loaded from a source such as an EEPROM into a programmable logic device responsive to cycles of a clock signal. To reduce the storage requirement for the EEPROM, the configuration data may be compressed. In addition, the compression of the configuration data decreases the amount of time needed to configure the corresponding programmable logic device. Because a programmable logic device is very sensitive to errors in the configuration data stream, any compression of the data must be lossless or perfect such that the decompressed configuration data is exactly the same as the configuration data before compression. In addition, only a portion of the configuration data can generally be compressed in light of the requirement for perfect compression. Thus, the configuration data being shifted into the device will comprise both uncompressed and compressed data. This mixed nature of the configuration data complicates the configuration data flow. Any compressed configuration data must be decompressed before configuration may be completed. However, the configuration data is being shifted at a constant rate responsive to cycles of the clock signal. When data is decompressed, this constant rate must necessarily change. This adds complexity to the configuration process because it must accommodate the rate changes depending upon whether configuration data being shifted in was compressed or not. This accommodation may take place in the programming tool providing the bit stream or may take place within the device. Regardless of where the accommodation takes place, it adds considerable complexity to the configuration circuitry and the software controlling the configuration process. Moreover, this complexity inherently limits the bit rate of the configuration data stream. As a result of this complexity, comparatively few programmable devices utilize configuration data compression, particularly in low-cost devices.

Accordingly, there is a need in the art for improved decompression techniques for data streams.

SUMMARY

One aspect of the invention relates to a data decompression circuit for a data stream having a repeated data word, the data stream including a series of data frames such that the repeated data word is removed from the series of data frames, each data frame including a header, comprising: a decompression engine configured to decompress each data frame into a corresponding decompressed data frame, the decompression engine being further configured to decode each header to identify whether word locations in the corresponding decompressed data frame should be filled with the repeated data word.

Another aspect of the invention relates to a method of decompressing a data frame into a decompressed data frame, comprising: decoding a header in the data frame to identify whether locations in the decompressed data frame correspond to a repeated data word and to identify whether locations in the decompressed data frame correspond to uncompressed data words.

Another aspect of the invention relates to a data decompression circuit, comprising: a data input circuit operable to receive a data stream that includes data frames having a header and body, the header indicating the location within the body of one or more data words absent from the body; and a data decompression engine coupled to the data input circuit, the data decompression engine operable to read the header of a data frame to determine the location within the body of an absent data word and to insert the absent word into its proper location.

Another aspect of the invention relates to a data frame for carrying compressed data, comprising: a body containing uncompressed data words; and a header that indicates the location within the body of one or more data words absent from the body.

BRIEF DESCRIPTION OF THE DRAWINGS

Use of the same reference symbols in different figures indicates similar or identical items.

DETAILED DESCRIPTION

Figure 1:
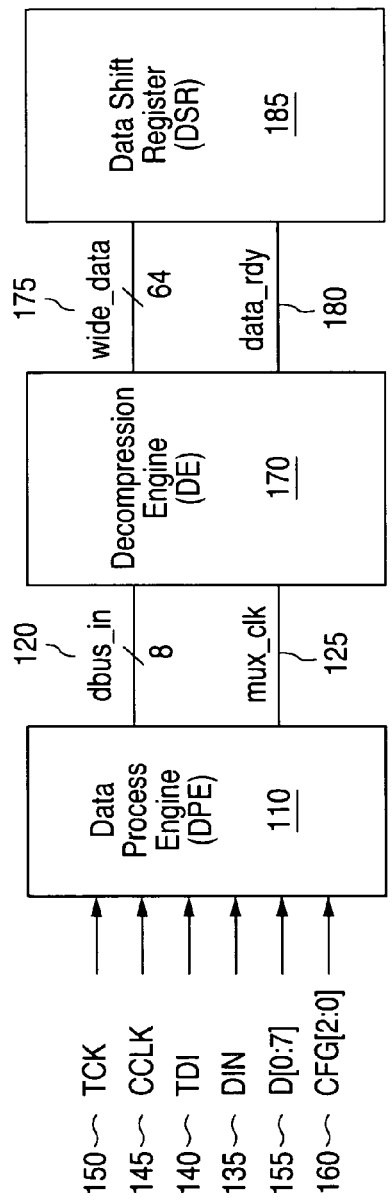
FIG. 1 is a block diagram of a decompression circuit according to an embodiment of the invention.

During the configuration of a programmable logic device such as a field programmable gate array (FPGA), it is common that a substantial portion of the configuration data stream maps to logic resources that are not used. For example, an FPGA may contain thousands of logic blocks. However, when an FPGA is programmed to implement a user's desired logical function, only a subset of the available logic blocks is typically utilized. The configuration memory cells for these unused logical resources are programmed to a defined null state. For example, the configuration memory cells for an unused logic block may be programmed with all binary zeroes to signify that the logic block is to remain dormant during use of the corresponding programmable logic device. Alternatively, a null state may be indicated by having the configuration memory cells programmed with binary ones or some other binary combination. Thus, the configuration data stream for a programmable logic device will generally contain a substantial amount of repeated data words such as all binary zero (or all binary one) data words that correspond to the unused logical resources.

Other types of data streams will also include substantial amounts of repeated data words as well. The present invention exploits the redundant nature of such data streams by compressing the data streams into frames or groups of data such that the repeated data word is eliminated and thus absent from the groups. Each group of data includes a header that signifies the number and location of the absent data words corresponding to the original data stream prior to compression. After decompression, each group of data becomes a decompressed group of data comprising a number of data words. The number of data words corresponding to each decompressed frame/group of data may be varied according to individual design needs. Without loss of generality, the following discussion will assume that each decompressed frame corresponds to eight byte-long words. For such a frame size, eight bits may used in the header to signify whether a corresponding byte word in the decompressed frame is the repeated data word. A convenient correlation is that a first bit in the header corresponds to a first byte in the decompressed frame, a second bit in the header corresponds to a second byte in the decompressed frame, and so on. However, it will be appreciated that other mappings between bit positions in the header and corresponding words in the decompressed frame may be used.

An exemplary compression scheme may be described with respect to a programmable logic device. In a programmable logic device, the configuration data stream may contain many all-zero bytes corresponding to unused logical resources. A convenient compression scheme is to simply represent the all-zero bytes by a binary zero in the header. More generally, the data stream being compressed will contain some form of repeated data word. The header may represent this repeated data word by either a binary zero or a binary one. Without loss of generality, the following discussion will assume that this representation will be made using a binary zero.

An exemplary embodiment for a decompression circuit 100 for decompressing such a compressed data stream is illustrated in FIG. 1. Decompression circuit 100 includes an input circuit such as a data process engine 110 that functions to process data inputs to provide at its output an eight-bit bus (dbus_in) 120. Dbus_in 120 may be assembled from various compressed data stream sources. For example, data process engine 110 may support operation in either a bit mode or a byte mode. In a bit mode operation, data process engine 110 fills dbus_in 120 from a compressed serial bit stream whereas in a byte mode operation data process engine 110 fills dbus_in 120 from a compressed byte stream.

The compressed data streams that may be decompressed by decompression circuit 100 may originate from a variety of sources. For example, if the device including decompression circuit 100 supports operation in a Joint Test Action Group (JTAG) mode, the corresponding JTAG interface may be used to couple a compressed serial bit stream to data process engine 110 as a hybrid JTAG input, TDI 140. Alternatively, data process engine 110 may receive a compressed serial bit stream as an input DIN 135. In a byte mode of operation, data process engine 110 may received a compressed byte stream as an input D[0:7] 155. To control whether data process engine 110 operates in a bit or byte mode (and also whether the bit mode is a hybrid JTAG bit mode), data process engine 110 may receive a control variable CFG[2:0] 160.

It will be appreciated that data process engine 110 is illustrated as receiving byte stream D[0:7} 155 for conceptual purposes only in that data process engine 110 need do nothing to assemble this incoming byte stream onto dbus_in 120. However, in bit mode, data process engine 110 will receive a bit at a time and will thus function to assemble received bits into bytes for dbus_in 120. Regardless of whether the operation occurs in a bit or byte mode, the various compressed data streams received as inputs TDI 140, DIN 135, and D[0:7] 155 will be synchronized according to corresponding clocks. For example, TDI 140 is synchronized according to a JTAG clock TCK 150. The remaining inputs are synchronized according a clock CCLK 145. In a bit mode of operation, clock CCLK 145 cycles at the bit rate whereas in a byte mode of operation, clock CCLK 145 cycles at the byte rate. Depending upon the mode of operation, data process engine 110 selects from these clocks to provide a mux_clock 125 to a decompression engine 170.

Operation of decompression circuit 100 may be better understood with reference to several example compressed data streams for dbus_in 120. In this exemplary embodiment, each data frame is of variable size that depends upon the number of uncompressed data bytes that follow the header. Each frame starts with a header followed by a body. The header indicates the number of uncompressed data bytes in the body. Because the header in this example will be assumed to have a length of one byte, the maximum number of uncompressed data bytes in each frame will be eight. However, it will be appreciated that different maximum numbers of data bytes will be supported by varying the header size. Decompression engine 170 includes a state machine or decoder that functions to decode the header and assemble a wide_data bus 175 accordingly. Thus, decompression engine 170 functions to receive a group of data, decode its header, and insert any required repeated data word into its proper location amongst the uncompressed words in the group of data to form a decompressed group of data corresponding to the received group of data. In the embodiment illustrated, a maximum number of eight uncompressed data bytes may follow each header for a given frame. Thus, the width of wide_data bus 175 is eight bytes. Consider the following example header b00110101 received on dbus_in 120 by decompression engine 170. Decompression engine 170 decodes this header and recognizes that four uncompressed data bytes will follow this header as determined by the binary ones in the header. These four uncompressed data bytes may be denoted as data words data[0] through data[3]. The position or order of these uncompressed data bytes in the decompressed group of data formed on wide_data bus 175 may be coded by their position in the header. Wide_data bus 175 may be considered as ordered from a least significant byte[0] through a most significant byte[7]. Given such an ordering and mapping it to corresponding bit positions in the header, decompression engine 170 may place data [3] as byte [0] on wide_data bus 175, data [2] will be byte [2], data [1] will be byte [4], and data [0] will be the byte [5].

The remaining bits in this example header are all zero. In this exemplary embodiment, zero bits correspond to the repeated data word in the compressed data stream, which is assumed to be an all zero byte. Thus, bytes [7], [6], [3], and [1] are all zero bytes. It will be appreciated, however, that the repeated data word need not equal an all zero word. The resulting decompression from the original frame on dbus_in 120 to the decompressed frame on wide_data bus 175 may be seen in the following representations:

If the original group of data (having a header and body) is:

| Header | Data[0] | Data[1] | Data[2] | Data[3] |
|---|---|---|---|---|
| b00110101 | b10011110 | b10010011 | b1101110 | b00100000 |

The resulting decompressed group of data is:

| byte[7] | byte[6] | byte[5] | byte[4] | byte[3] | byte[2] | byte[1] | byte[0] |
|---------|---------|---------|---------|---------|---------|---------|---------|
| b00000000 | b00000000 | b10011110 | b10010011 | b00000000 | b11101110 | b00000000 | b00100000 |

Given this form of decompression, it may be seen that if the header is all binary ones, the frame/group of data will comprise eight uncompressed data bytes. For example, suppose the group of data is:

| header | Data[0] | Data[1] | Data[2] | Data[3] | Data[4] | Data[5] | Data[6] | Data[7] |
|--------|---------|---------|---------|---------|---------|---------|---------|---------|
| b11111111 | b10011110 | b10010011 | b11101110 | b00100000 | b01111111 | b10111111 | b11011111 | b11101111 |

Because there are no zero bits in this header, the resulting decompressed group of data is simply the eight bytes following the header:

| byte[7] | byte[6] | byte[5] | byte[4] | byte[3] | byte[2] | byte[1] | byte[0] |
|---------|---------|---------|---------|---------|---------|---------|---------|
| b10011110 | b10010011 | b11101110 | b00100000 | b01111111 | b10111111 | b11011111 | b11101111 |

On the other hand, if the header is all binary zeroes instead of binary ones as in the preceding example, the frame/group of data will simply comprise the header such that the group of data is represented as:

| header |
|--------|
| b00000000 |

Given such a frame, the resulting decompressed data becomes:

| byte[7] | byte[6] | byte[5] | byte[4] | byte[3] | byte[2] | byte[1] | byte[0] |
|---------|---------|---------|---------|---------|---------|---------|---------|
| b00000000 | b00000000 | b00000000 | b00000000 | b00000000 | b00000000 | b00000000 | b00000000 |

| header | Data[0] |
|--------|---------|
| b00100000 | b10011110 |

Given such a frame, the resulting decompressed data becomes:

Another exemplary frame may comprise just one uncompressed data byte that should map to the byte [5] position. Such a frame may be represented as:

| byte[7] | byte[6] | byte[5] | byte[4] | byte[3] | byte[2] | byte[1] | byte[0] |
|---------|---------|---------|---------|---------|---------|---------|---------|
| b00000000 | b00000000 | b10011110 | b00000000 | b00000000 | b00000000 | b00000000 | b00000000 |

When decompression engine 170 has decompressed a frame into the corresponding decompressed frame of data on wide_data bus 175, it may then signal that the data is ready for utilization using a signal such as data_rdy 180. In the embodiment illustrated, decompression circuit 100 is included in a programmable logic device such as an FPGA including a data shift register 185 that will receive the decompressed data from wide_data bus 175. When signaled by an assertion of data_rdy 180, data shift register 185 may receive the decompressed data on wide_data bus 175.

Figure 2:
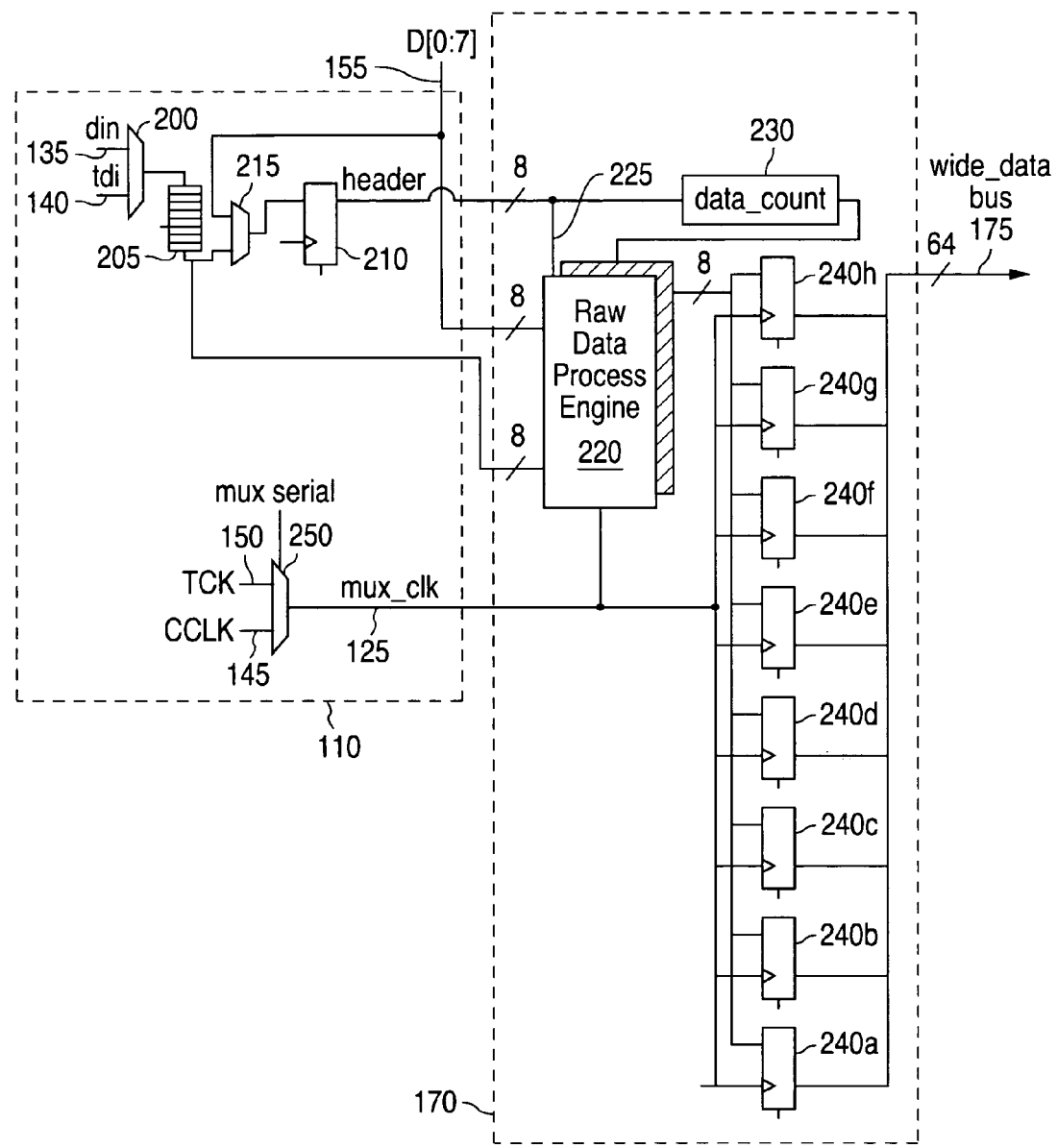
FIG. 2 is a block diagram illustrating further aspects of the decompression circuit of FIG. 1.

A more detailed block diagram of exemplary embodiments for data process engine 110 and decompression engine 170 is illustrated in FIG. 2. Data process engine 110 includes a multiplexer 200 that selects between DIN 135 and TDI 140 in the bit mode of operation depending upon whether a hybrid JTAG mode is also enabled. To assemble a byte for processing by decompression engine 170, data process engine 110 may include a shift register 205 that receives an output of multiplexer 200. Alternatively, in the byte mode of operation, bytes are received on input bus D[0:7] 155. To provide a header byte to decompression engine 170, data process engine 110 may include a header register 210 that selects for an input using a multiplexer 215. In the byte mode, multiplexer 215 selects for input bus D[0:7] 155 whereas in the bit mode, multiplexer 215 selects for an output from shift register 205.

Decompression engine 170 may include a raw data process engine 220 that receives a header input 225 from header register 210. Raw data process engine 220 includes a state machine or processor configured to decode the received header as discussed previously. Because the header determines how many uncompressed data words will follow in the corresponding frame, the header also determines when the next header may be expected. A counter 230 may be triggered by header input 225 to set a count corresponding to the number of uncompressed data bytes that will follow the header. Raw data process engine 220 also decodes the header to determine the location of the uncompressed data bytes in the decompressed data frame being assembled on wide_data bus 175. To assemble the bytes onto wide_data bus 175, raw data process engine 220 may couple to byte registers 240, arranged from a least significant byte register 240a to a most significant byte register 240h. For example, if the header is b00010001, the binary ones in the header may be decoded to indicate that two uncompressed data bytes will follow in the body. The initial uncompressed data byte will be mapped to byte register 240e whereas the subsequent uncompressed data byte will be mapped to byte register 240a. Because all the remaining bits in this example header are zero, registers 240b, 240c, 240d, 240f, 240g, and 240h would be loaded with all zero byte words by raw data process engine 220. Registers 240 may all be clocked by mux_clock 125. To indicate which register should be enabled to respond to mux_clock 125 so as to register a byte provided by raw data process engine 220, raw data process engine 220 may provide a shift enable signal (not illustrated) to registers 240. Raw data process engine 220 may receive the uncompressed data bytes from either input bus D[0:7] 225 or shift register 205 depending upon whether a bit or byte mode of operation is enabled. Having loaded all registers 240, raw data process engine 220 may then activate data_ready signal 180 (FIG. 1) to signify that the data on wide_data bus 175 is ready for processing. Counter 230 may then signal data process engine 110 to load header register 210 with the subsequent header.

Data process engine 110 may include a multiplexer 250 to select for mux_clock 125. Multiplexer 250 receives clocks TCK 150 and CCLK 145 and selects the appropriate clock depending upon whether a hybrid JTAG mode of operation is enabled. The resulting mux_clock 125 may then be distributed to raw data process engine 220 and registers 240.

Advantageously, decompression engine 170 may process dbus_in 120 at a constant byte rate, regardless of the amount of compression involved. The timing of such a byte-by-byte constant processing may be determined by mux_clock 125. Should data process engine 110 be in bit mode, mux_clock 125 will cycle according to the bit rate. Thus, decompression engine 170 would simply respond to every eighth cycle of mux_clock 125 in the bit mode. In a byte mode of operation, decompression engine 170 may respond to every cycle of mux_clock 125 since it will cycle according to the byte rate in the byte mode of operation. Regardless of whether a byte or bit mode of operation is enabled, decompression engine 175 processes data on dbus_in 120 at a constant word rate, thereby eliminating the problems encountered in conventional decompression circuits regarding the different rates required for processing compressed and uncompressed data. It thus doesn't matter whether data on dbus_in 120 is compressed or uncompressed, compression engine 170 may process it a regular byte-by-byte basis. It will be appreciated that such processing may be applied to other word lengths besides bytes.

Figure 3:
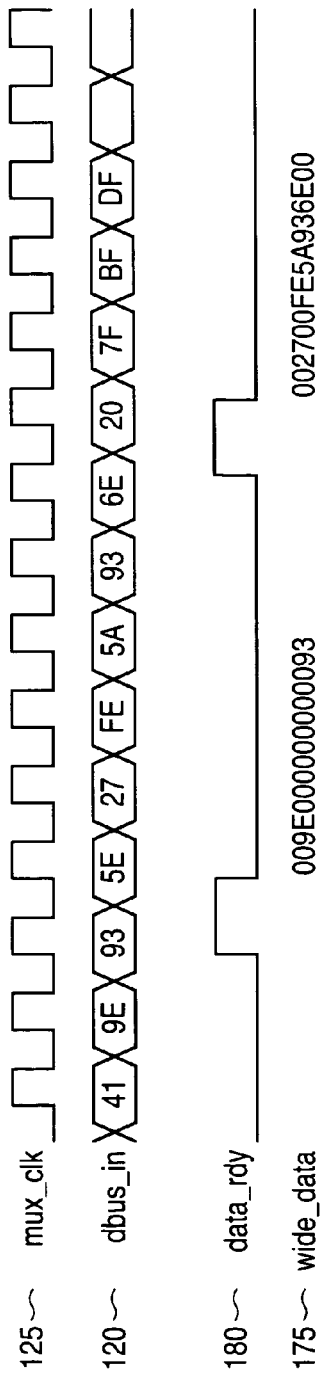
FIG. 3 is a timing diagram for various signals within the decompression circuit of FIG. 1.

The regular processing of words by decompression engine 170 may be better understood with reference to the timing relationships illustrated in FIG. 3. In the embodiment illustrated, mux_clk 125 cycles at the byte rate such that a byte mode of operation is enabled. The bytes on dbus_in 120 are represented in hexadecimal format. The initial header on dbus_in 120 is 41, which indicates that two uncompressed words (represented as 9E and 93) will follow to be included in the corresponding group of data or frame corresponding to this header. The remaining bytes in this group of data will be all binary zero words. After byte 93 has been processed, data_ready 180 may be asserted to signify that the group of data has been assembled. The subsequent header byte is 5E, which indicates that five uncompressed bytes follow—these bytes are represented as 27, FE, 5A, 93, and 6E. The remaining bytes in this group of data will be all binary zero words. Finally, the subsequent header byte is 20, which signifies that one uncompressed byte will follow, which is represented as 7F.

It may be shown that the compression efficiency by the above-described compression scheme depends upon the frequency of the repeated data word that is being eliminated. Using the exemplary decompressed frame length of eight bytes, the overhead introduced by the header is 12.5%. Thus, so long as the repeated data word has a greater frequency than 12.5%, it would behoove a user to use the compression/decompression scheme described herein. In that regard, the embodiments of the present invention described herein are merely illustrative. For example, the repeated data word that is eliminated from each frame/group of data following a header need not be an all-zero data word. Moreover, the word size for the repeated data word and the uncompressed data words may be varied from the byte length described herein. Finally, the number of data words within each group of data need not be eight but instead may be varied as desired. Therefore, the above-described embodiments of the present invention are not limiting. It will thus be obvious to those skilled in the art that various changes and modifications may be made without departing from this invention in its broader aspects. Accordingly, the appended claims encompass all such changes and modifications as fall within the true spirit and scope of this invention.

We claim:

1. A data decompression circuit comprising:
a decompression engine for decompressing a data stream having a series of variable-sized data frames each having a header indicating the number and location of compressed repeated data words and uncompressed data words in the data frame followed by a body that includes the uncompressed data words in the data frame, the decompression engine including:
a data process engine adapted to decode the header of a data frame to identify the uncompressed data word locations and compressed repeated data word locations therein and to insert an uncompressed data word from the body of the data frame and a repeated data word into their respective word locations in a corresponding decompressed data frame;
a counter adapted to determine from the header the number of uncompressed data words in the data frame; and
a header register coupled to the counter and the data process engine for providing the header of a data frame, the register adapted to load the header of a second data frame in response to a load signal indicating that a first data frame has been decompressed into a corresponding decompressed data frame,
the data process engine responsive to the number determined by the counter to insert in a separate clock cycle each uncompressed data word into its word location in the decompressed data frame and to insert in one clock cycle the repeated data words into their word locations in the decompressed data frame.

2. The data decompression circuit of claim 1 including a plurality of registers coupled to the data process engine, each register corresponding to a word location in a decompressed data frame, the data process engine adapted to write each uncompressed data word to the corresponding register in a separate clock cycle and the repeated data words to the corresponding registers in one clock cycle.

3. The data decompression circuit of claim 1, wherein the load signal originates from the counter.

4. The data decompression circuit of claim 1 including:
a shift register adapted to receive the data stream in serial form and convert it to parallel form;
an input parallel bus adapted to receive the data stream in parallel form; and
a multiplexer adapted to select between the shift register and the input parallel bus as an input to the header register.

5. The data decompression circuit of claim 1, wherein the data decompression circuit is included within a programmable logic device.

6. The programmable logic device of claim 5, further comprising a configuration memory, wherein the decompression circuit is operable to provide the decompressed data frames to the configuration memory.

7. The programmable logic device of claim 6, wherein the configuration memory is a non-volatile memory.

8. A data decompression circuit comprising:
means for receiving a data stream having a series of variable-sized data frames each having a header indicating the number and location of compressed repeated data words and uncompressed data words in the data frame followed by a body that includes the uncompressed data words in the data frame;
means for decoding the header of a data frame to identify the uncompressed data word locations and compressed repeated data word locations therein;
means for determining from the header of a data frame the number of uncompressed data words in the data frame;
a header register coupled to the determining means and the decoding means for providing the header of a data frame, the register adapted to load the header of a second data frame in response to a load signal indicating that a first data frame has been decompressed into a corresponding decompressed data frame; and
means responsive to the determined number for inserting in a separate clock cycle each uncompressed data word from the frame body into its word location in a corresponding decompressed data frame and for inserting in one clock cycle the repeated data words into their word locations in the corresponding data frame.

9. A method of decompressing a data stream comprising:
receiving a data stream having a series of variable-sized data frames each having a header indicating the number and location of compressed repeated data words and uncompressed data words in the data frame followed by a body that includes the uncompressed data words in the data frame;
loading the header of a first data frame into a header register;
decoding the header of the first data frame to identify the uncompressed data word locations and compressed repeated data word locations therein;
determining from the header the number of uncompressed data words in the first data frame;
responsive to the determined number, inserting in a separate clock cycle each uncompressed data word from the body of the first data frame into its word location in a corresponding decompressed data frame and inserting in one clock cycle the repeated data words into their word locations in the corresponding decompressed data frame; and
loading the header of a second data frame into the header register in response to a load signal indicating that the first data frame has been decompressed into the corresponding decompressed data frame.

10. The method of claim 9, wherein the determining step comprises counting the number of uncompressed data word locations in the header of the first data frame.

* * * * *

UNITED STATES PATENT AND TRADEMARK OFFICE
CERTIFICATE OF CORRECTION

PATENT NO. : 7,589,648 B1
APPLICATION NO. : 11/054855
DATED : September 15, 2009
INVENTOR(S) : Ma et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 911 days.

Signed and Sealed this

Twenty-first Day of September, 2010

David J. Kappos
*Director of the United States Patent and Trademark Office*